US011968797B2

(12) United States Patent
Placke

(10) Patent No.: US 11,968,797 B2
(45) Date of Patent: Apr. 23, 2024

(54) MEMORY DEVICES, CARRIERS FOR SAME, AND RELATED COMPUTING SYSTEMS AND METHODS

(71) Applicant: Micron Technology, Inc., Boise, ID (US)

(72) Inventor: Michael G. Placke, McKinney, TX (US)

(73) Assignee: Micron Technology, Inc., Boise, ID (US)

(*) Notice: Subject to any disclaimer, the term of this patent is extended or adjusted under 35 U.S.C. 154(b) by 77 days.

(21) Appl. No.: 17/393,572

(22) Filed: Aug. 4, 2021

(65) Prior Publication Data
US 2022/0046818 A1 Feb. 10, 2022

Related U.S. Application Data

(60) Provisional application No. 63/061,639, filed on Aug. 5, 2020.

(51) Int. Cl.
*H05K 1/18* (2006.01)
*G06F 3/06* (2006.01)
*H05K 7/14* (2006.01)

(52) U.S. Cl.
CPC ......... *H05K 7/1492* (2013.01); *G06F 3/0688* (2013.01); *H05K 1/181* (2013.01); *H05K 2201/10159* (2013.01)

(58) Field of Classification Search
CPC .. H05K 1/14; H05K 1/141–144; H05K 5/026; H05K 5/0269; H05K 5/0273;
(Continued)

(56) References Cited

U.S. PATENT DOCUMENTS 5,477,426 A * 12/1995 Bethurum ............ G06K 19/077
361/737
5,493,477 A * 2/1996 Hirai ................... H05K 5/0269
361/752
(Continued)

FOREIGN PATENT DOCUMENTS

CN 201185533 Y 1/2009
CN 101593010 A 12/2009
(Continued)

OTHER PUBLICATIONS

Chinese First Office Action for Chinese Application No. 202110891565.3, dated Feb. 8, 2023, 27 pages with translation.
(Continued)

*Primary Examiner* — Tuan T Dinh
(74) *Attorney, Agent, or Firm* — TraskBritt

(57) ABSTRACT

Memory devices including a substrate supporting at least one semiconductor device thereon. The substrate includes an interface sized, shaped, and configured to provide electrical connection to the at least one semiconductor device, the interface located proximate to an end of the substrate. Engagement structures are located proximate to, and laterally outward from, the interface. The engagement structures extend laterally beyond a remainder of a lateral periphery of the substrate, each engagement structure comprising a first depth at a first portion of the engagement structure and a second, smaller depth at a second, laterally inward portion of the engagement structure. A carrier includes supports shaped, positioned, and configured to be positioned in the second portions of the engagement structures to secure the end of the substrate to the carrier.

23 Claims, 10 Drawing Sheets

(58) Field of Classification Search
CPC .... H05K 1/18; H05K 1/181–188; H05K 7/02; H05K 7/14; G06F 3/0625; G06F 3/0635; G06F 12/0238; G06F 12/0246
USPC .......................................... 361/736–759, 803
See application file for complete search history.

(56) References Cited

U.S. PATENT DOCUMENTS

| | | | | |
|---|---|---|---|---|
| 5,563,771 | A * | 10/1996 | Bethurum | H05K 5/0269 257/679 |
| 5,673,181 | A * | 9/1997 | Hsu | H05K 5/0269 439/946 |
| 5,687,064 | A * | 11/1997 | Nichols | H05K 5/0273 361/752 |
| 6,769,540 | B2 | 8/2004 | Hsieh et al. | |
| 6,877,995 | B1 | 4/2005 | Chen | |
| 7,019,980 | B2 * | 3/2006 | Gu | H05K 5/0269 361/737 |
| 7,301,776 | B1 * | 11/2007 | Wang | G06F 21/78 360/137 |
| 7,517,231 | B2 * | 4/2009 | Hiew | H05K 9/0067 439/76.1 |
| 7,576,990 | B2 * | 8/2009 | Ni | G06V 40/1365 361/737 |
| 7,768,789 | B2 * | 8/2010 | Ni | H05K 5/0269 361/730 |
| 7,869,218 | B2 * | 1/2011 | Ni | H05K 5/0273 361/741 |
| 7,944,703 | B2 * | 5/2011 | Ni | G07C 9/257 361/728 |
| 8,363,417 | B2 * | 1/2013 | Gunderson | H05K 7/00 361/740 |
| 8,508,928 | B2 | 8/2013 | Killen et al. | |
| 9,301,402 | B2 | 3/2016 | Herman et al. | |
| 9,510,474 | B2 * | 11/2016 | Chou | H05K 7/142 |
| 9,603,280 | B2 | 3/2017 | Frank et al. | |
| 9,607,660 | B2 | 3/2017 | Bennett, II et al. | |
| 9,933,822 | B2 * | 4/2018 | Tan | H05K 5/0008 |
| 10,320,105 | B2 * | 6/2019 | Yun | H05K 1/117 |
| 10,346,735 | B1 | 7/2019 | Lee | |
| 2002/0167092 | A1 | 11/2002 | Fee et al. | |
| 2007/0245047 | A1 | 10/2007 | Chung et al. | |
| 2012/0287590 | A1 * | 11/2012 | Zhang | H01R 13/62994 248/225.11 |
| 2014/0078682 | A1 * | 3/2014 | Jenks | H01R 13/62905 361/727 |
| 2015/0355686 | A1 | 12/2015 | Heyd et al. | |
| 2019/0044259 | A1 | 2/2019 | Khan et al. | |

FOREIGN PATENT DOCUMENTS

| | | |
|---|---|---|
| CN | 101751090 A | 6/2010 |
| CN | 105739640 A | 7/2016 |
| CN | 207925136 U | 9/2018 |
| TW | 534555 U | 5/2003 |

OTHER PUBLICATIONS

Chinese Second Office Action for Chinese Application No. 202110891565.3, dated Aug. 31, 2023, 24 pages with translation.

* cited by examiner

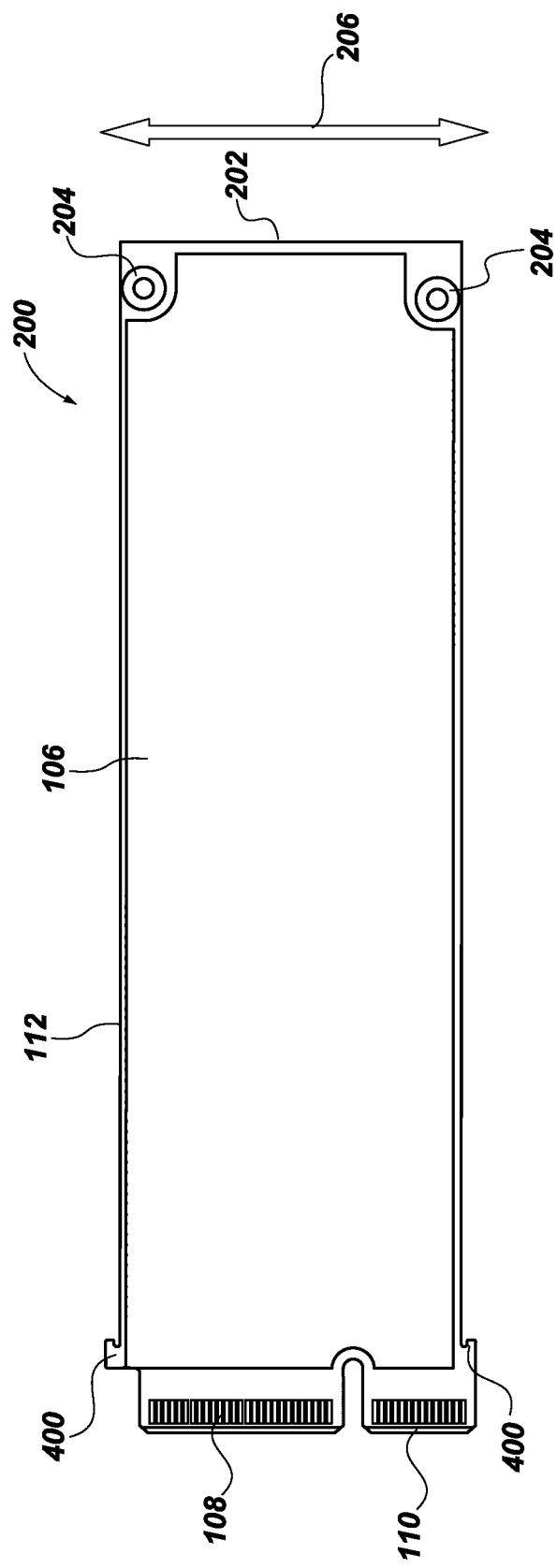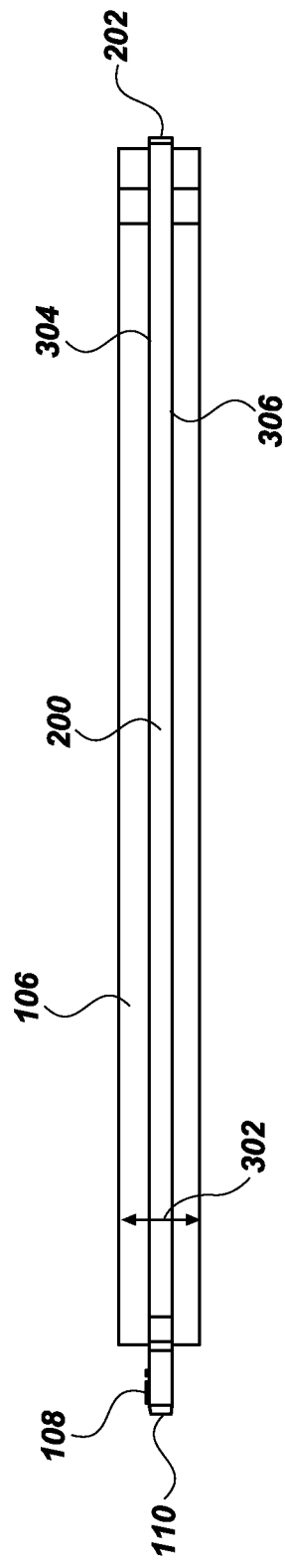
FIG. 2
FIG. 3

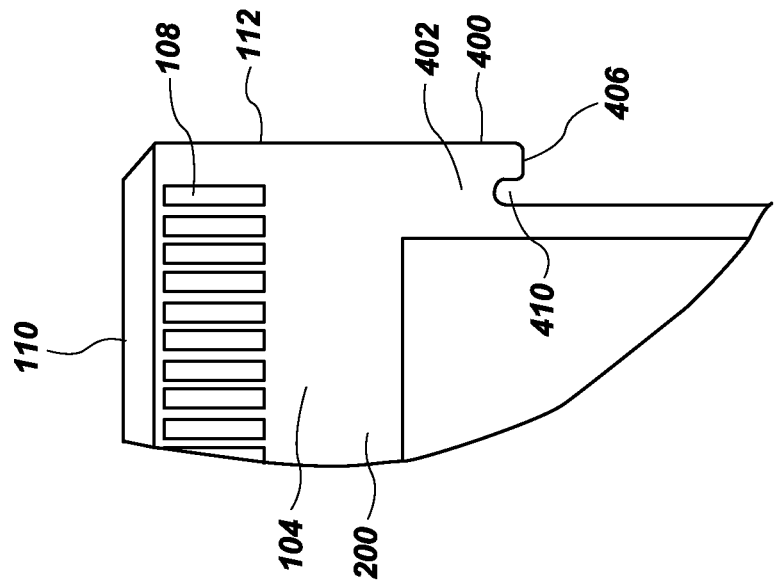
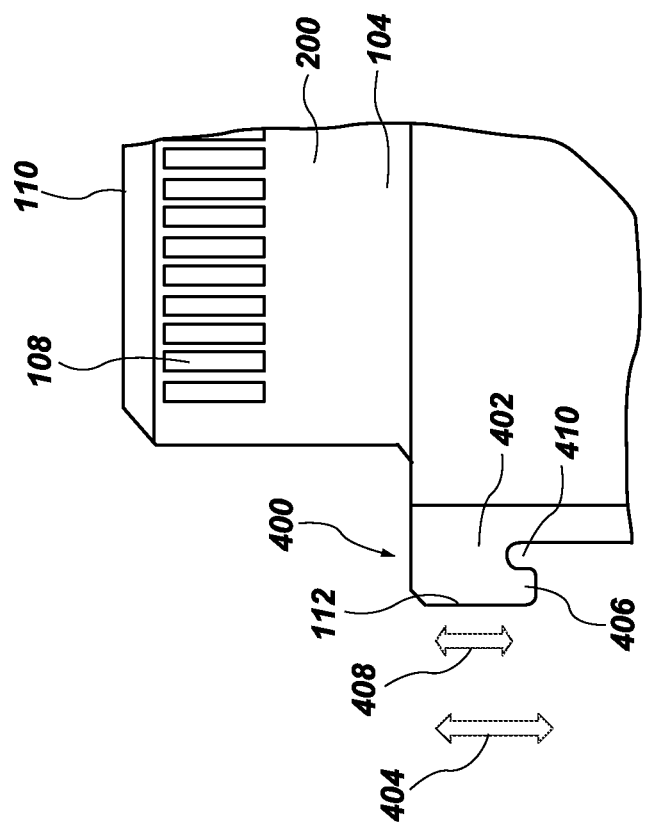

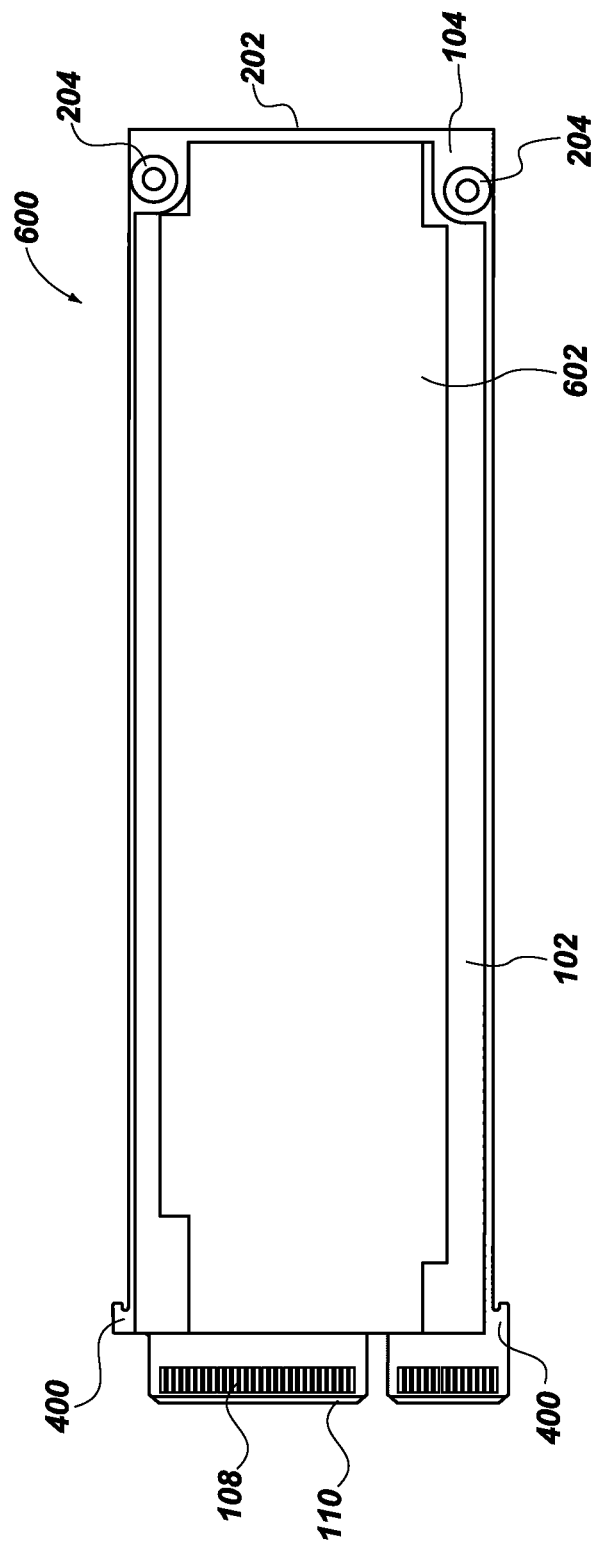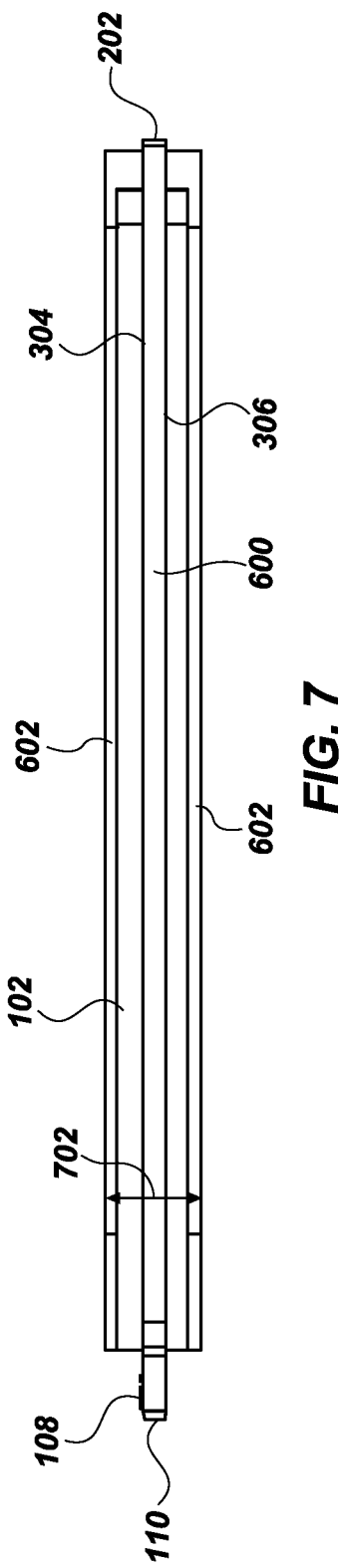

MEMORY DEVICES, CARRIERS FOR SAME, AND RELATED COMPUTING SYSTEMS AND METHODS

CROSS-REFERENCE TO RELATED APPLICATION

This application claims the benefit under 35 U.S.C. § 119(e) of U.S. Provisional Patent Application Ser. No. 63/061,639, filed Aug. 5, 2020, the disclosure of which is incorporated herein in its entirety by this reference.

FIELD

This disclosure relates generally to configurations for memory devices and associated computing systems and methods. More specifically, disclosed embodiments relate to carriers for assembly with cooperatively configured memory devices, which assemblies may allow more efficient configuration of the memory devices as well as deployment of the memory devices in smaller spaces in greater quantities for use by certain computing systems, such as servers, as well as allow easier replacement of memory devices in the computing systems.

BACKGROUND

Servers used to store and deliver data for use by clients over the Internet typically include equipment racks (e.g., rack shelves) supporting computing components, which are themselves supported in a server rack (e.g., a cabinet). The equipment racks may be provided in standardized sizes, which may generally cover a given surface area of the server rack and occupy a standardized height within the server rack. For example, equipment racks may be provided in 1U, 2U, or 3U configurations, and so on (also characterized as "one unit," "two unit," etc.). The heights of such equipment racks may generally increase by about 1.75 inch (about 44 mm) per unit.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings. In the drawings:

FIG. 2 is a top view of a substrate of the memory device of FIG. 1;

FIG. 3 is a side view of the substrate of FIG. 2;

FIG. 4 is an enlarged top view of an engagement structure of the memory device of FIG. 1 through FIG. 3;

FIG. 5 is an enlarged top view of another engagement structure of the memory device of FIG. 1 through FIG. 3;

FIG. 6 is a top view of another embodiment of a substrate usable with the memory device of FIG. 1;

FIG. 7 is a side view of the substrate of FIG. 6;

DETAILED DESCRIPTION

Figure 1:
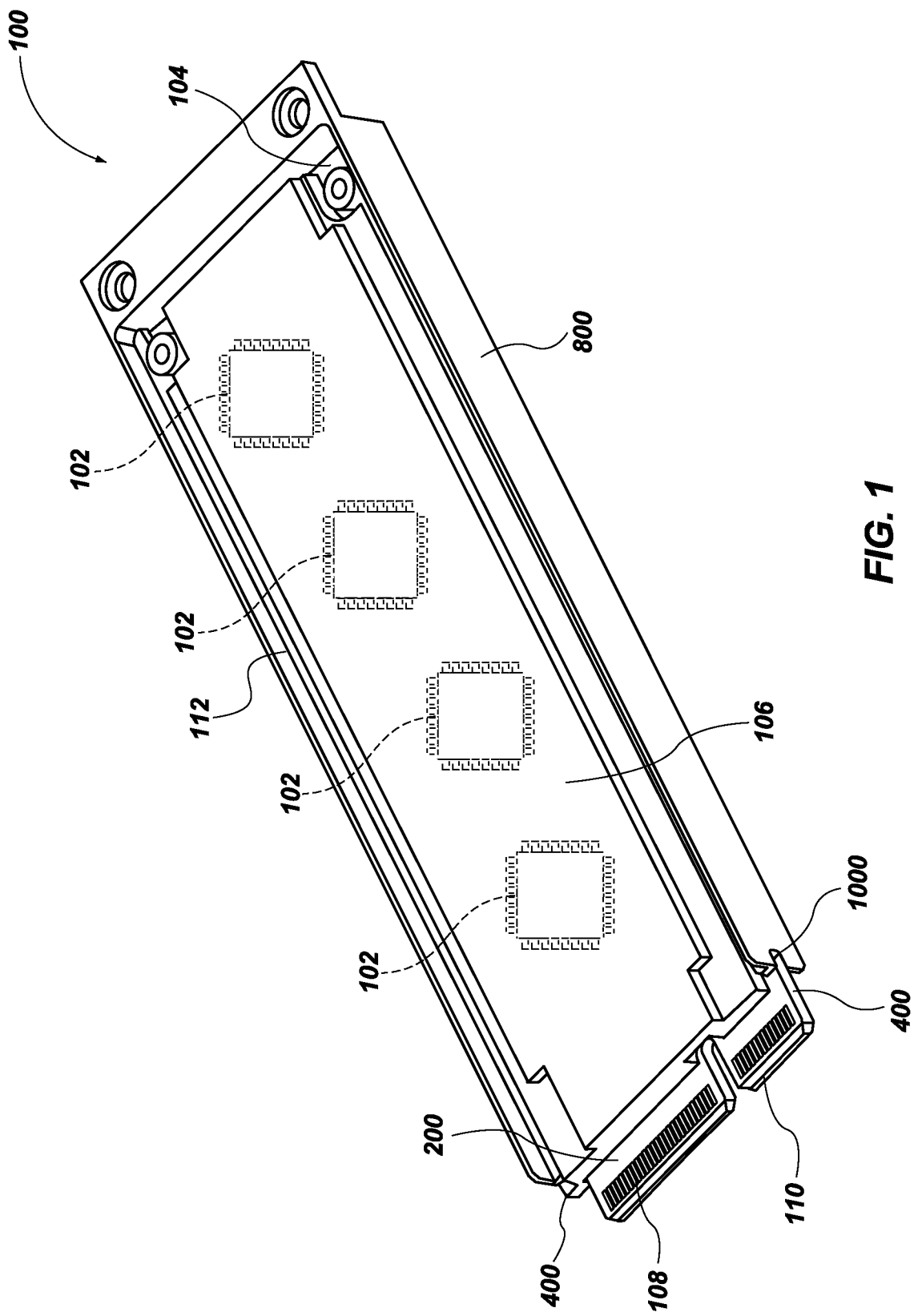
FIG. 1 is a perspective side view of a memory device in accordance with this disclosure.

The illustrations presented in this disclosure are not meant to be actual views of any particular memory device or component thereof, but are merely idealized representations employed to describe illustrative embodiments. Thus, the drawings are not necessarily to scale.

Memory devices in the form of memory modules having relatively small form factors, such as for example a 1U memory module in the form of an SFF-TA-1006 card (i.e., printed circuit board carrying multiple memory devices such as non-volatile memory of a solid-state drive), have extremely limited real estate, proving burdensome to component placement and routing. The use of fasteners near the connector end of such cards blocks efficient component placement, and fasteners requiring holes for mounting of the cards present a significant block to signal routing on the surface or inner layers of the card where significant signal traffic enters the card through its edge connector. In addition, current proposals limit the sharing of lower and higher power cards in slots in a server chassis.

Disclosed embodiments relate generally to carriers for assembling with memory devices, which may allow more efficient use of circuitry for given constraints of a particular form factor as well as allow deployment of the memory devices in smaller spaces in greater quantities for use by certain computing systems, such as servers. Replacement of such carrier and memory device assemblies in the computing systems may also be facilitated. More specifically, disclosed are embodiments of engagement structures in the form of carriers and cooperatively configured memory cards that may allow the memory cards to be more easily secured to, and removed from, server or other computer system housings, which may facilitate easier plug-and-play deployment as well as easier removal and replacement of the memory cards.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

The terms "memory" and "memory device," as used herein, include microelectronic devices exhibiting, but not limited to, memory functionality, but exclude embodiments encompassing transitory signals. For example, a system on a chip (SoC) is encompassed in the meaning of memory device. By way of non-limiting example, memory devices may generally include packaged semiconductor devices supported on substrates having form factors and mechanical support configurations as described herein, unless otherwise specified.

The term "memory card," as used herein, means and includes one or more semiconductor devices configured as memory supported on a substrate and one or more interfaces for routing signals from the interface, through electrical routing of the substrate, to a given semiconductor device. For example, memory cards include individual semiconductor packages configured as memory supported on printed circuit boards having interfaces configured as edge connectors for receipt in a corresponding slot or socket of higher-level packaging, such as a server rack.

FIG. 1 is a perspective side view of a memory device 100, which type of structure is conventionally characterized as a memory card, in accordance with this disclosure. The memory device 100 may include, for example, a substrate 200 supporting one or more semiconductor devices 102 thereon. The substrate 200 may be in the form of, for example, a printed circuit board (PCB) including a dielectric body and one or more layers of conductive traces and as well as vias of electrically conductive material carried by the dielectric body for routing electrical signals through the substrate 200. At least one of the semiconductor devices 102 may be configured as a memory chip (e.g., NAND flash, non-volatile memory). In some embodiments, each of the semiconductor devices 102 may be configured as a memory chip, collectively forming a memory block or drive (e.g., a solid-state drive, a non-volatile memory drive). The semiconductor device 102 may be located adjacent to major surface 104 (or a respective one of the major surfaces 104) of the substrate 200, and may be depicted in dashed lines in FIG. 1 to illustrate a shared overmold material 106 encapsulating the semiconductor devices 102 on the substrate 200. In other embodiments, the substrate 200 may lack such an overmold material 106, and the individually packaged semiconductor devices 102 may be visible on the major surface 104 (or major surfaces 104) of the substrate 200. In certain embodiments omitting the overmold material 106, multiple semiconductor devices 102 configured as bare semiconductor chips may be mounted on the substrate 200.

The substrate 200 may include an interface 108 sized, shaped, and configured to provide electrical connection to at least one, and typically all, of the semiconductor devices 102. The interface 108 may be configured as, for example, an edge connector conforming to one or more standardized specifications (e.g., STAT III Rev. 3.2). The interface 108 may be located proximate to an end 110 of the substrate 200. The end 110 may be exposed, and may extend beyond an associated carrier 800, enabling the interface 108 to be inserted into a receiving socket.

The substrate 200 may also include, for example, engagement structures 400 located proximate to, laterally outward from, and longitudinally trailing the interface 108. The engagement structures 400 may extend laterally beyond a longitudinally trailing remainder of a lateral periphery 112 of the substrate 200, the lateral periphery 112 being located on sides of the substrate 200 perpendicular to the end 110 where the interface 108 is located. Each engagement structure 400 may be configured to secure the end 110 of the substrate 200 to the associated carrier 800.

The carrier 800 of the memory device 100 may include supports 1000 shaped, positioned, and configured to engage with the engagement structures 400 of the substrate 200. The engagement structures 400 and supports 1000 may cooperatively enable quicker installation of the substrate 200 in the carrier 800, quicker removal of the substrate 200 from the carrier 800, and quicker deployment of a substitute substrate 200 in the carrier 800. As a result, any failure or malfunction of the memory device 100 may be more quickly addressed, operation of an associated system with the memory device 100 reinstalled may resume more quickly, and upgrades to the memory device 100 may be accomplished more easily.

FIG. 2 is a top view of a substrate 200 of the memory device 100 of FIG. 1. FIG. 3 is a side view of the substrate 200 of FIG. 2. Referring collectively to FIG. 2 and FIG. 3, the substrate 200 may include semiconductor devices 102 (FIG. 1) on both major surfaces 104 of the substrate 200. For example, the substrate 200 may include a first major surface 304 having at least one of the semiconductor devices 102 (FIG. 1) supported thereon, and a second major surface 306 located on an opposite side of the substrate 200 and having at least another of the semiconductor devices 102 (FIG. 1) supported thereon. The overmold material 106 may likewise be located on, and cover at least portions of, the first major surface 304 and the second major surface 306. In some embodiments, the overmold material 106 may cover a majority of each of the first major surface 304 and the second major surface 306, and may encapsulate a plurality of the semiconductor devices 102 (FIG. 1) located on each respective major surface 104 of the substrate 200. In other embodiments, the overmold material 106 may be limited to individual packaged semiconductor devices 102 (FIG. 1), and may cover a minority of at least one, and optionally both, of the first major surface 304 and the second major surface 306.

The substrate 200 may further include holes 204, slots, or other recesses extending through the substrate 200. The holes 204 may be located proximate to another end 202 of the substrate 200 opposite the interface 108. The holes 204 may be positioned, shaped, and configured to enable the other end 202 of the substrate 200 to be secured to the carrier 800 (see FIG. 1) by fasteners (e.g., rivets, screws, pins, snap-fit connectors) as known in the art.

A greatest lateral width 206 of the substrate 200, as measured from a laterally outermost portion of one engagement structure 400 to a laterally outermost portion of the other engagement structure 400 and in a direction in plane with one of the major surfaces 104, may be less than 1U, as that term is used in connection with an equipment rack for a server. For example, the greatest lateral width 206 of the substrate 200 may be about 34 mm or less. More specifically, the greatest lateral width 206 of the substrate 200 may be between about 30 mm and about 34 mm (e.g., about 32 mm).

A maximum thickness 302 of the substrate 200, including the overmold material 106, may be maintained at or below a specified threshold. For example, the maximum thickness 302 may be about 8 mm or less. More specifically, the maximum thickness 302 of the substrate 200, including the overmold material 106, may be between about 5 mm and about 7 mm (e.g., about 6 mm). Maintaining the maximum thickness 302 of the substrate 200 at or below the specified threshold may enable greater density of deployment of the memory devices 100 in a given system, and reduce the risk of encroaching into space dedicated to other components.

FIG. 4 is an enlarged top view of an engagement structure 400 of the memory device 100 of FIG. 1 through FIG. 3. FIG. 5 is an enlarged top view of another engagement structure 400 of the memory device of FIG. 1 through FIG. 3. With combined reference to FIG. 4 and FIG. 5, each engagement structure 400 may generally be shaped as, for example, a hook or latch for engaging with one of the supports 1000 (see FIG. 1) of the carrier 800 (see FIG. 1) to secure the end 110 of the substrate 200 to the carrier 800. More specifically, each engagement structure 400 may include, for example, a first portion 406 located proximate to a lateral periphery 112 of the substrate 200 and a second portion 402 adjacent to, and laterally inward from, the first portion 406 with respect to the lateral periphery 112, such that the first portion 406 may be interposed between the second portion 402 and the lateral periphery 112. The first portion 406 may have a first depth 404, as measured in a direction from the end 110 of the substrate 200 toward the other, opposite end 202 and in the same plane as one of the major surfaces 104, and the second portion 402 may have a second, smaller depth 408, forming a hook-shaped recess 410 proximate to the second portion 402 into which the support 1000 (see FIG. 1) of the carrier 800, which may be in the form of a post perpendicular to the plane of substrate and of lesser lateral extent than a width of recess 410 may be received.

In embodiments where the end 110 of the substrate 200 remains at least substantially linear as the end 110 extends laterally across the first portion 406 and the second portion 402, the first depth 404 and the second, smaller depth 408 may be measured from edge to edge. In other embodiments where the end 110 of the substrate 200 is nonlinear across the first portion 406 and the second portion 402, the first depth 404 and the second, smaller depth 408 may be measured from an arbitrary line parallel to a farthest leading edge of the substrate 200 at the end 110 and intersecting with the interface 108. Stated another way, a first point on the first portion 406 located closest to the other end 202 (see FIG. 2) of the substrate 200 may be located laterally outward from a second point on the second portion 402 located closest to the end 110 of the substrate 200. A line connecting the first point to the second point being oriented at an oblique angle when compared to a leading edge of the substrate 200 at the end 110, and may extend from proximate to the other end 202 (see FIG. 2) toward proximate to the end 110 as the line extends laterally inward from the lateral periphery 112.

FIG. 6 is a top view of another embodiment of a substrate 600 usable with the memory device 100 of FIG. 1. FIG. 7 is a side view of the substrate 600 of FIG. 6. In some embodiments, the substrate 600 may include one or more heat-management structures 602 positioned, shaped, and configured to facilitate dissipation and/or transfer of heat generated by the semiconductor devices 102. For example, the heat-management structures 602 may be configured as heat spreaders, thermal pads, thermal tapes, or other thermal management structures known in the art, and each heat-management structure 602 may include a mass of thermally conductive material in thermal communication with the semiconductor devices 102 and located on a side of the semiconductor devices 102 opposite the substrate 200. More specifically, each heat-management structure 602 may include, for example, a mass of thermally conductive metal or metal alloy material (e.g., copper, aluminum, gold) in contact with surfaces of the semiconductor devices 102 through a dielectric thermal interface material (TIM) on a side of the relevant semiconductor devices 102 opposite the substrate 600. In some embodiments where the substrate 600 includes semiconductor devices 102 on both of the first major surface 304 and the second major surface 306, the substrate 600 may likewise include heat-management structures 602 in contact with the semiconductor devices 102 on both sides. In other embodiments, the substrate may include a single heat-management structure 602 overlying only one of the first major surface 304 or the second major surface 306.

A maximum thickness 702 of the substrate 600, and the heat-management structures 602, may be maintained below a specified threshold. For example, the maximum thickness 702 may be about 10 mm or less. More specifically, the maximum thickness 702 of the substrate 600 and the heat-management structure 602, may be between about 7 mm and about 9 mm (e.g., about 8 mm).

The substrate 200 of FIG. 2 and FIG. 3 may generally be configured as a lower-power rated device, such that heat-management structures 602 may not be required to maintain operating temperatures within recommended temperatures. The substrate 600 of FIG. 6 and FIG. 7 may generally be configured as a higher-power rated device, such that the heat-management structures 602 may better enable the operating temperatures to remain within recommended limits. For example, the substrate 200 of FIG. 2 and FIG. 3 may have a power rating of between about 75% and about 90% (e.g., about 80%) of a power rating of the substrate 600 of FIG. 6 and FIG. 7. More specifically, the substrate 200 of FIG. 2 and FIG. 3 may have a power rating of between about 10 W and about 14 W (e.g., about 12 W), and a power rating of the substrate 600 of FIG. 6 and FIG. 7 may be greater and between about 14 W and about 18 W (e.g., about 16 W).

Figure 8:
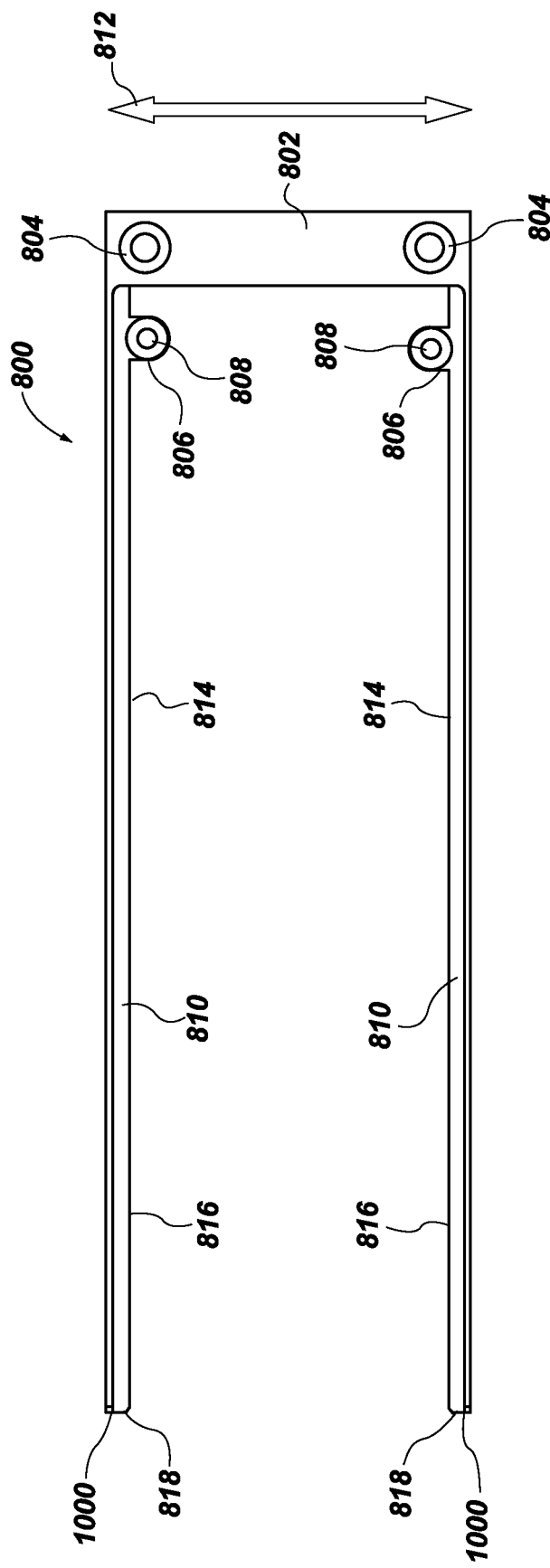
FIG. 8 is a top view of a housing of the memory device of FIG. 1.
Figure 9:
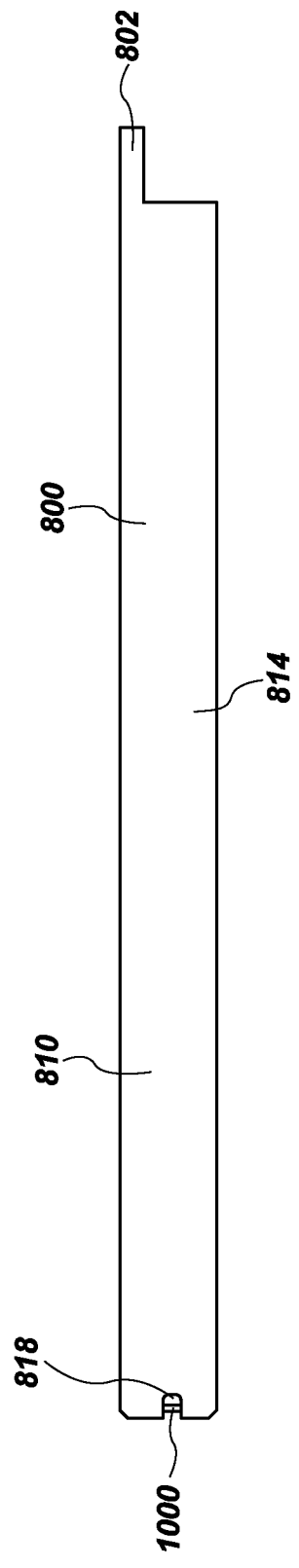
FIG. 9 is a side view of the housing of FIG. 8.

FIG. 8 is a top view of a carrier 800 of the memory device 100 of FIG. 1. FIG. 9 is a side view of the carrier 800 of FIG. 8. Referring collectively to FIG. 8 and FIG. 9, the carrier 800 may include a crossbar 802 at a base end thereof for positioning proximate to the other end 202 (see FIG. 2) of the substrate 200 opposite interconnect. The carrier 800 may also include sidewalls 810 having parallel, vertically spaced rails 816 (FIG. 10) defining channels 818 (FIG. 10) extending longitudinally from the crossbar 802 for receiving lateral edges of the remainder of the lateral periphery 112 (see FIG. 1) of the substrate 200 between the engagement structures 400 and the other end 202. The carrier 800, including the crossbar 802 and the sidewalls 810, may be characterized as a frame and generally form a "C" or "U" shape.

Holes 804 may extend vertically through the crossbar 802. The holes 804 may be oriented such that central axes of the holes 804 are at least substantially perpendicular to the major surfaces 104 (see FIG. 1) of the substrate 200 (see FIG. 2) when the substrate 200 is installed in the carrier 800. The holes 804 may be sized and shaped to receive fasteners through the holes 804 to secure the carrier 800 in place, such as, for example, in an equipment rack. For example, fasteners in the form of screws, bolts, or pins may be inserted through the holes 804 and through corresponding holes in the equipment rack structure to secure the carrier 800 to the equipment rack. In some embodiments, the holes 804 may be threaded, to be cooperatively engaged with threaded fasteners (not shown).

A greatest width 812 of the crossbar 802, as measured in a direction at least substantially perpendicular to the sidewalls 810, may be equal to or less than 1U of a server rack. For example, the greatest width 812 of the crossbar 802 may be about 40 mm or less. More specifically, the greatest width 812 of the crossbar 802 may be between about 30 mm and about 38 mm (e.g., about 34 mm, about 36 mm), and specifically about 31.5 mm in the case of the SFF-TA-1006 standard form factor.

The carrier 800 may include protrusions 806 extending from each respective sidewall 810 toward the other respective sidewall 810. The protrusions 806 may include other holes 808 extending through the protrusions 806. The other holes 808 may be oriented such that central axes of the other holes 808 are at least substantially perpendicular to the major surfaces 104 (see FIG. 1) of the substrate 200 (see FIG. 2) when the substrate 200 (see FIG. 2) is installed in the carrier 800. The other holes 808 may be positioned to align with the holes 204 (see FIG. 2) in the substrate 200 (see FIG. 2) when the engagement structures 400 (see FIG. 4) are engaged with the supports 1000. The other holes 808, and the holes 204 (see FIG. 2) in the substrate 200 (see FIG. 2), may be sized and shaped to receive connectors through the holes 204 (see FIG. 2) and the other holes 808 to secure the other end 202 (see FIG. 2) of the substrate 200 (see FIG. 2) to the carrier 800. For example, fasteners in the form of screws, bolts, or pins may be inserted through the holes 204 (see FIG. 2) in the substrate 200 (see FIG. 2) and through the other holes 808 in the carrier 800 to secure the other end 202 (see FIG. 2) of the substrate 200 (see FIG. 2) to the carrier 800 and prevent longitudinal disengagement of engagement structures of substrate 200 with supports 1000. In some embodiments, the other holes 808 may be threaded, to be cooperatively engaged with threaded fasteners (not shown). In some other embodiments, the other end 202 (FIG. 2) of the substrate 200 (FIG. 2) may be secured to the carrier 800 proximate to the crossbar 802 utilizing other mechanical attachments, such as, for example, a snap fit, a latch, or other mechanical attachment known in the art.

Figure 10:
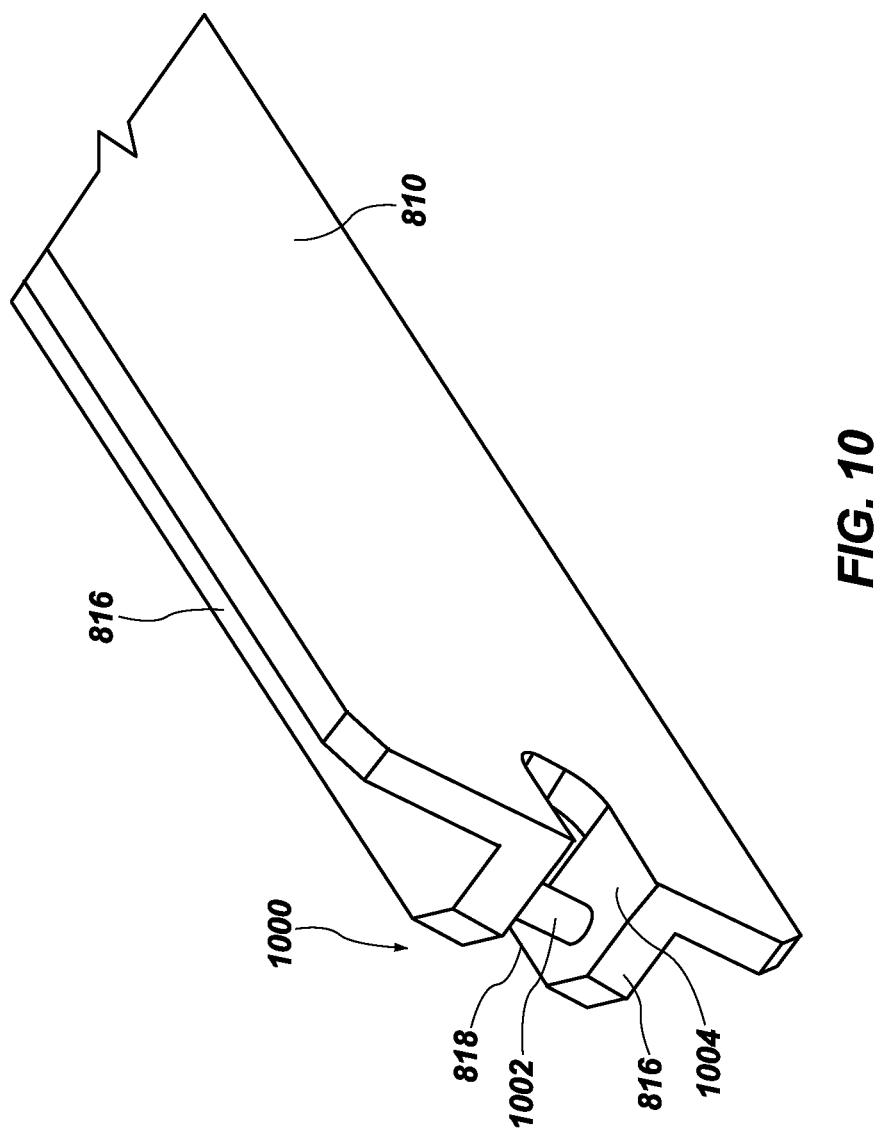
FIG. 10 is a perspective side view of a support of the housing of FIG. 1, FIG. 8, and FIG. 9.

FIG. 10 is a perspective side view of a support 1000 of the carrier 800 of FIG. 1, FIG. 8, and FIG. 9. The supports 1000 may include cutouts 1002 in the sidewalls 810, the cutouts 1002 positioned to receive laterally extending engagement structures 400 (FIG. 1) of substrates 200, 600 (FIGS. 2, 6) and allow alignment of supports 1000 with recesses 410 (FIG. 4) of the engagement structures 400 (see FIG. 4) of the substrate 200 (see FIG. 2). For example, the cutouts 1002 may define recesses extending through thicknesses of the sidewalls 810 in a direction parallel to a line connecting the central axes of the holes 804 (see FIG. 8) in the crossbar 802 (see FIG. 8) of the carrier 800 (see FIG. 8). Each support 1000 may further include a post 1004 adjacent the associated cutout 1002 and extending vertically between rails 816, spanning a channel 814. Each post 1004 may be sized, positioned, oriented, and configured to be received in a recess 410 proximate to the second portion 402 (see FIG. 4) of the engagement structure 400 (see FIG. 4) to secure the end 110 (see FIG. 1) of the substrate 200 (see FIG. 2) to the carrier 800. For example, the engagement structures 400 (see FIG. 4) may be aligned with the cutouts 1002, and the posts 1004 may be received into the recesses 410 (see FIG. 4) defined by the second portions 402 (see FIG. 4) of the engagement structures 400 (see FIG. 4) as the lateral edges of substrate 200 (see FIG. 2) slide longitudinally into channels 818. Latching the first portions 406 (see FIG. 4) of the engagement structures 400 around the posts 1004 within recesses 410 (see FIG. 4) may quickly and temporarily secure the end 110 (see FIG. 1) of the substrate 200 (see FIG. 2) to the supports 1000 of the carrier 800 (see FIG. 8) until the substrate 200 (see FIG. 2) can be more permanently longitudinally secured with fasteners to the carrier 800 (see FIG. 8) utilizing the holes 204 (see FIG. 2) in the other end 202 (see FIG. 2) and corresponding other holes 808 (see FIG. 8) in the protrusions 806 (see FIG. 8) extending from the sidewalls 810 of the carrier 800 (see FIG. 8).

In summary, memory devices in accordance with this disclosure may include a substrate supporting at least one semiconductor device thereon. The substrate may include an interface located proximate to an end of the substrate and sized, shaped, and configured to provide external electrical connection to the at least one semiconductor device. Engagement structures may be located proximate to, and laterally outward from, the interface, the engagement structures extending laterally beyond a longitudinal remainder of a lateral periphery of the substrate trailing the engagement structures. Each engagement structure may include a first depth at a first portion of the engagement structure and a second, smaller depth at a second, laterally inward portion of the engagement structure to define a recess therebetween. A carrier may include supports shaped, positioned, and configured to be positioned in the recesses of the engagement structures to secure the end of the substrate to the carrier.

In addition, carriers for memory modules in accordance with some embodiments of this disclosure may include, for example, a crossbar extending laterally between mutually parallel sidewalls at one end of the carrier. Mutually parallel rails may define channels extending longitudinally from proximate the crossbar to proximate an opposing end of the carrier. A support structure may include a post extending vertically between the rails of each sidewall in a channel, the support structure further including a cutout in an adjacent sidewall laterally outwardly of the post. Protrusions may be located proximate the crossbar and may extend laterally inwardly from each sidewall, the protrusions extending inwardly of a channel of the respective sidewall of the protrusion. Each protrusion may have a vertical aperture therethrough positioned for alignment with an aperture of a memory module having lateral edges received within the channel and recesses of laterally outwardly protruding engagement structures of the substrate receiving the posts therein.

In some embodiments, a memory module comprises a substrate bearing multiple memory chips on at least one side thereof, the substrate having an interconnect in the form of an edge connector at one end thereof in communication with the multiple memory chips through conductive traces and vias carried by a dielectric material of the substrate. The substrate further comprises engagement structures on opposing edges of the substrate longitudinally trailing the interconnect and extending laterally outwardly therefrom, the engagement structures comprising hooks defining recesses opening to the rear of the engagement structures. A portion of the substrate trailing the engagement structures is of a lesser width than a width of the substrate at the engagement structures, and the substrate further comprises apertures proximate an end of the substrate opposite the interconnect and adjacent opposing edges of the substrate.

Figure 11:
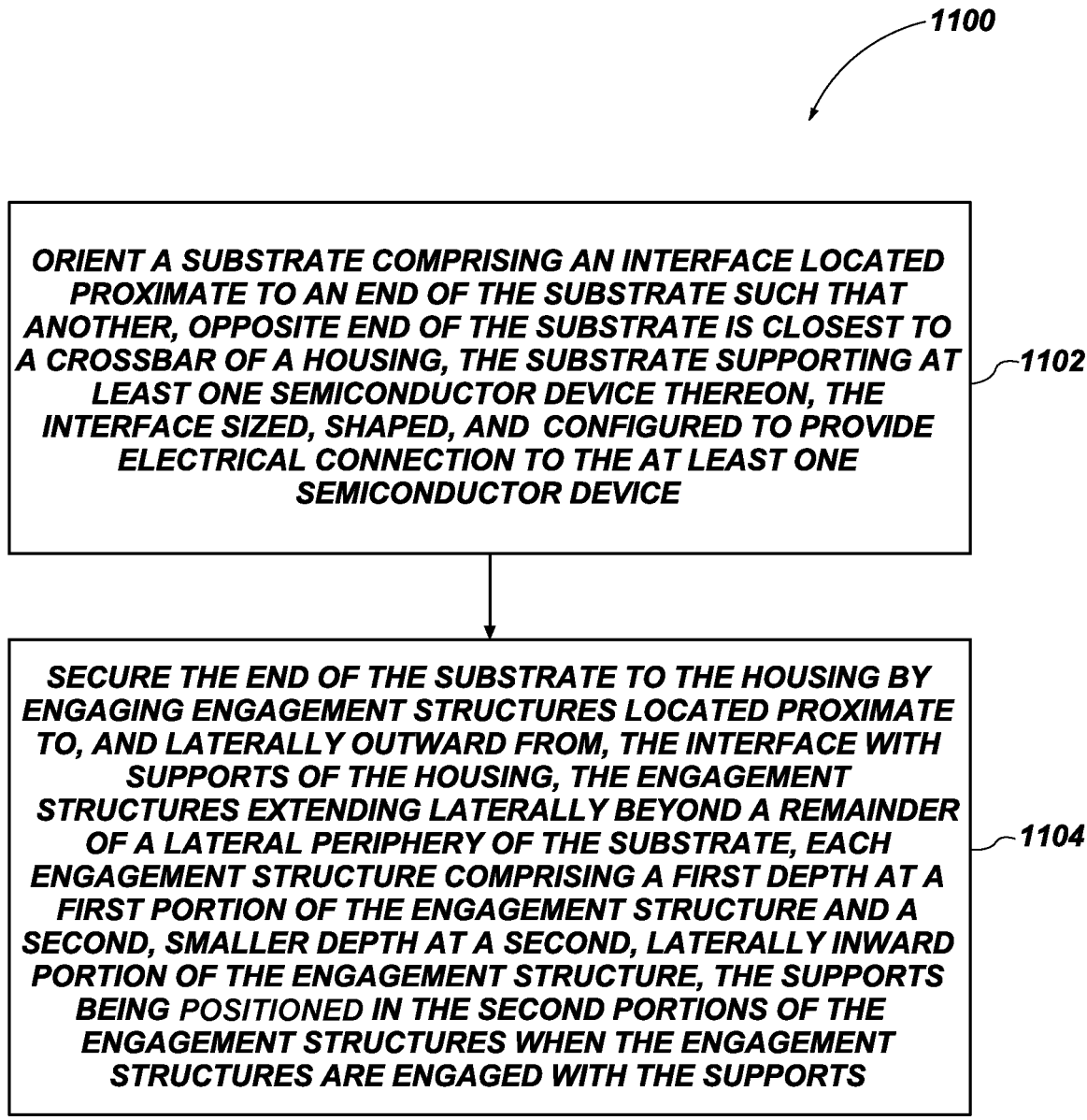
FIG. 11 is a flowchart of a method of making a semiconductor device in accordance with this disclosure.

FIG. 11 is a flowchart of a method 1100 of making a semiconductor device in accordance with this disclosure. The method 1100 may involve inserting a substrate into a carrier, the substrate comprising an interface located proximate to a longitudinal end of the substrate such that another, opposite end of the substrate is proximate a crossbar of a carrier, as indicated at act 1102 when the substrate is inserted into the carrier, lateral edges of the substrate being received in longitudinal channels in sidewalls of the carrier. The substrate may support at least one semiconductor device thereon, and the interface may be sized, shaped, and configured to provide electrical connection to the at least one semiconductor device, as further indicated at act 1102.

The end of the substrate may be secured to the carrier by engaging engagement structures located proximate to, and laterally outward from, the interface with supports of the carrier, as indicated at act 1104. The engagement structures may extend laterally beyond a remainder of a lateral periphery of the substrate, each engagement structure comprising a first depth at a first portion of the engagement structure and a second, smaller depth at a second, laterally inward portion of the engagement structure, to form recesses as also indicated at act 1104. The supports may be positioned in the recesses of the engagement structures when the engagement structures are engaged with posts of the supports, as again indicated at act 1104.

In some embodiments, engaging the engagement structures with the support may involve positioning a post of each support proximate to the second portions of the engagement structures, each post spanning a cutout in a respective sidewall of the carrier extending from the crossbar along the remainder of the lateral periphery of the substrate. In such embodiments, displacement of the substrate in directions perpendicular to major surfaces of the substrate may be delimited utilizing surfaces defining the cutouts, the surfaces defining the cutouts located proximate to ends of the posts.

In some embodiments, the method 1100 may further involve aligning holes extending through the substrate with other holes extending through protrusions of the carrier. The holes of the substrate may be located proximate to another, opposite end of the substrate, and each protrusion may extend laterally inward from a respective sidewall of the carrier toward another respective sidewall. Each protrusion may include one of the other holes extending through the protrusion, and each respective sidewall extending from the crossbar along the remainder of the lateral periphery of the substrate. The other end of the substrate may then be secured to the carrier by inserting an attachment member through each set of a hole of the substrate and another hole of a respective protrusion of the carrier.

Once the substrate is installed in the carrier to form the semiconductor device, the carrier may be secured within, for example, a 1U equipment rack of a server.

In summary, methods of making semiconductor devices in accordance with this disclosure may involve, for example, orienting a substrate including an interface located proximate to an end of the substrate such that another, opposite end of the substrate is proximate a crossbar of a carrier. The substrate may support at least one semiconductor device thereon, and the interface may be sized, shaped, and configured to provide external electrical connection to the at least one semiconductor device. The end of the substrate may be secured to the carrier by engaging engagement structures located proximate to, and laterally outward from, the interface with supports of the carrier. The engagement structures may extend laterally beyond a remainder of a lateral periphery of the substrate, each engagement structure including a first depth at a first portion of the engagement structure and a second, smaller depth at a second, laterally inward portion of the engagement structure. The supports may be positioned laterally within the second portions of the engagement structures when the engagement structures are engaged with the supports.

Figure 12:
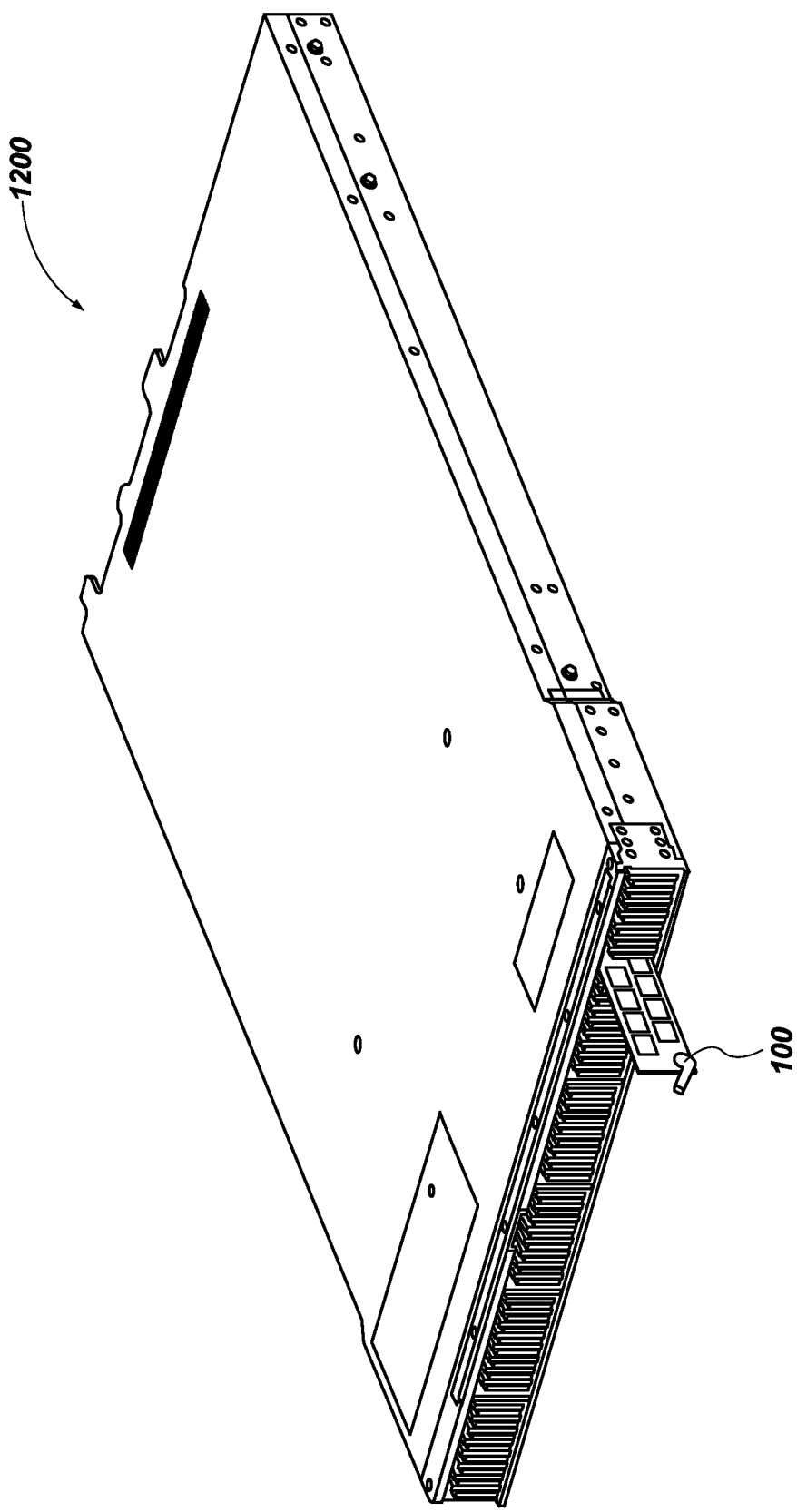
FIG. 12 is a perspective side view of an equipment rack which may support semiconductor devices in accordance with this disclosure.
Figure 13:
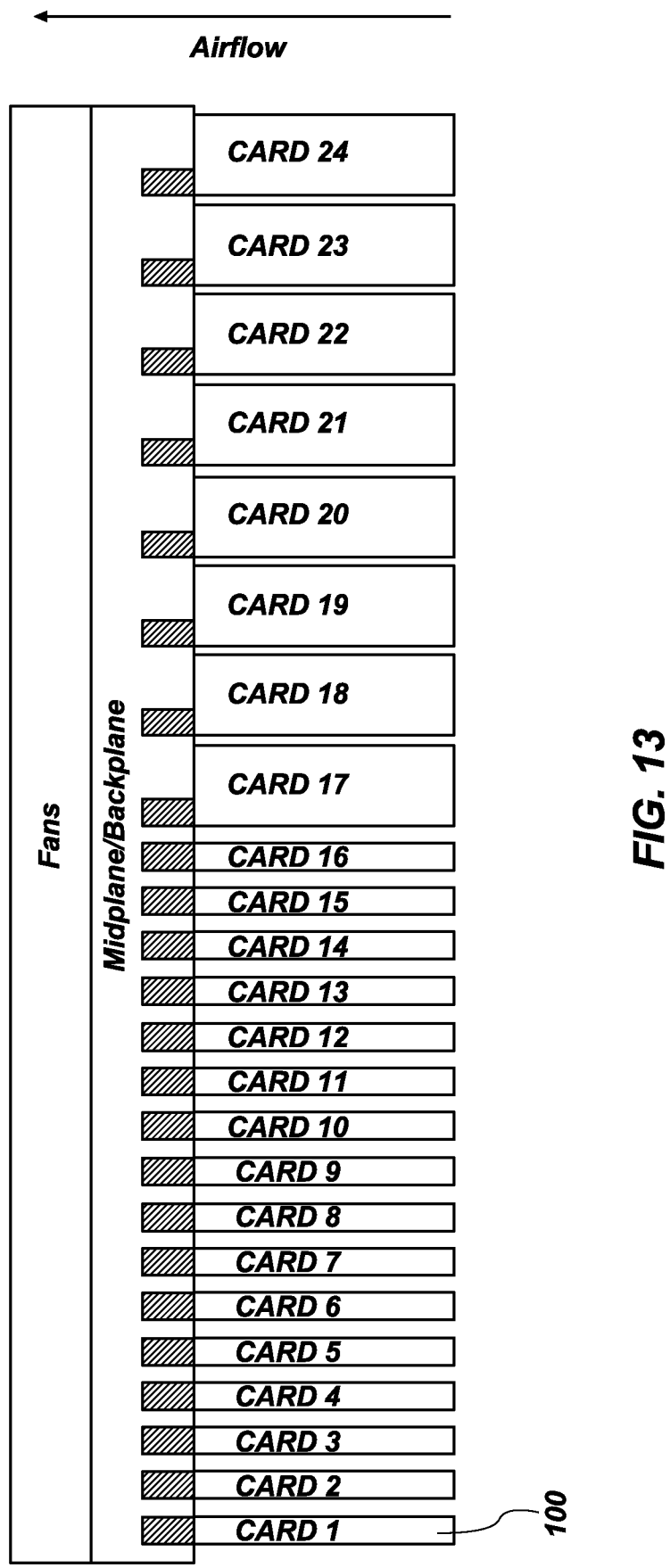
FIG. 13 is a top, schematic view of a portion of an interior of the equipment rack of FIG. 12.

FIG. 12 is a perspective side view of an equipment rack 1200, which may support memory devices 100 in accordance with this disclosure. FIG. 13 is a top, schematic view of a portion of an interior of the equipment rack 1200 of FIG. 12. Referring collectively to FIG. 12 and FIG. 13, the memory devices 100 may be inserted into the equipment rack 1200 with the interface 108 (see FIG. 1) at a leading end of the memory device 100 entering the equipment rack 1200 first. The interface 108 may be inserted into, and electrically connected to, a corresponding socket in a midplane or backplane of the equipment rack. Fans located on a side of the midplane or backplane may, as shown in FIG. 13, provide for airflow to cool the memory devices 100 supported in the equipment rack 1200. Multiple memory devices 100 may be connected to the same midplane or backplane, enabling a large amount of data storage to be provided in a small space in the server.

Figure 14:
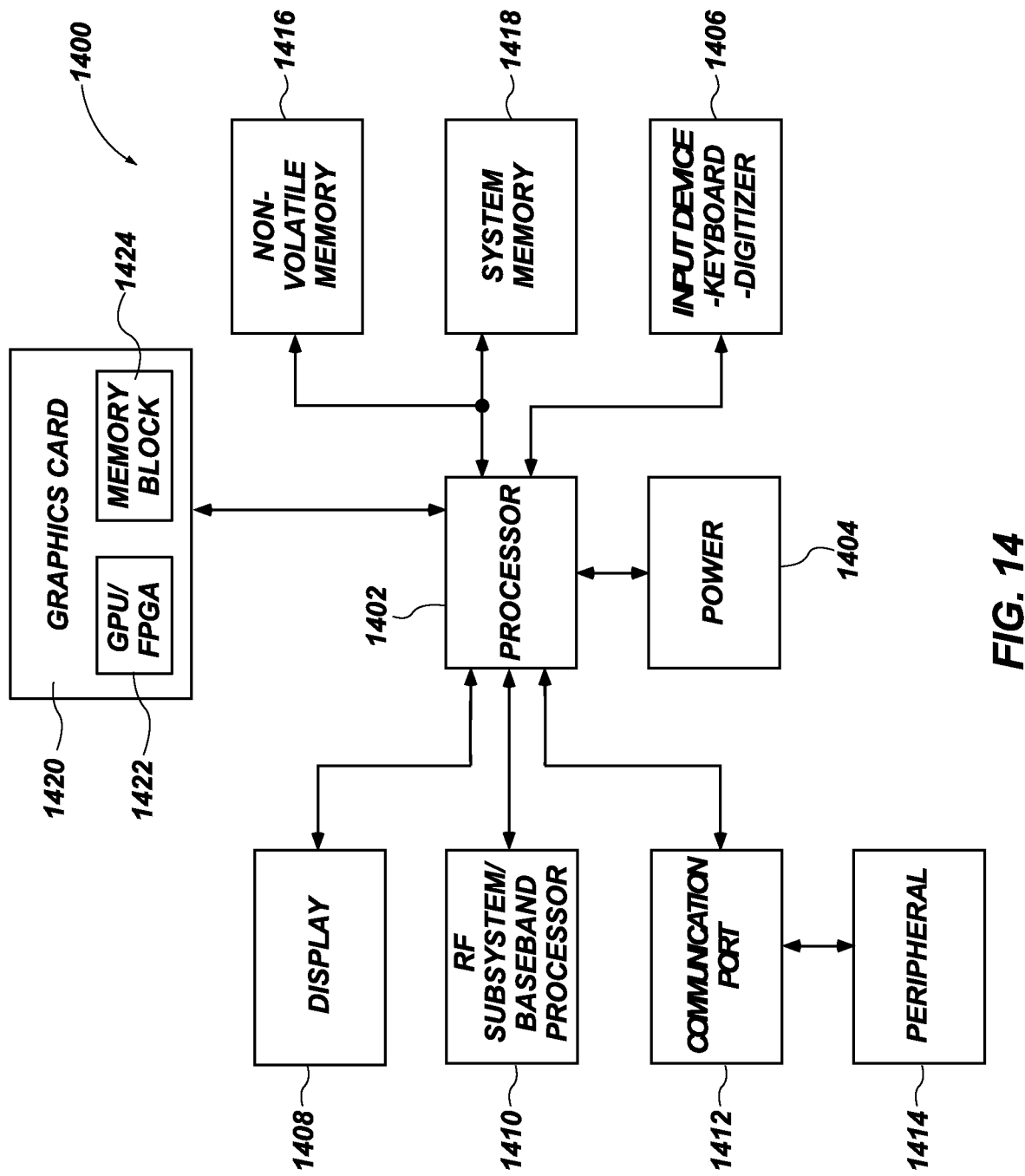
FIG. 14 is a block diagram of an electronic system incorporating memory devices in accordance with embodiments of the disclosure.

FIG. 14 is a block diagram of an electronic system 1400 incorporating one or more memory devices in accordance with embodiments of the disclosure. For example, memory devices in accordance with the disclosure may operate as system memory 1418 (e.g., random-access memory (RAM)) or non-volatile memory 1416 (e.g., solid-state drive (SSD) storage). The electronic system 1400 may include various semiconductor devices manufactured in accordance with embodiments of the present disclosure. For example, the electronic system 1400 may be any of a variety of types, such as a server, computer, tablet, cellular phone, smartphone, control circuit, or other electronic device. The electronic system 1400 may include one or more processors 1402, such as a microprocessor, to control the processing of system functions and requests in the electronic system 1400.

The electronic system 1400 may include a power supply 1404 in operable communication with the processor 1402. For example, if the electronic system 1400 is a portable system, the power supply 1404 may include one or more of a fuel cell, a power scavenging device, permanent batteries, replaceable batteries, and/or rechargeable batteries. The power supply 1404 may also include an AC adapter; therefore, the electronic system 1400 may be plugged into a wall outlet, for example. The power supply 1404 may also include a DC adapter such that the electronic system 1400 may be plugged into a vehicle cigarette lighter or a vehicle power port, for example.

Various other devices may be coupled to the processor 1402 depending on the functions that the electronic system 1400 performs. For example, a user interface 1406 may be coupled to the processor 1402. The user interface 1406 may include input devices such as buttons, switches, a keyboard, a light pen, a mouse, a digitizer and stylus, a touch screen, a voice recognition system, a microphone, or a combination thereof. A display 1408 may also be coupled to the processor 1402. The display 1408 may include an LCD display, an SED display, a CRT display, a DLP display, a plasma display, an OLED display, an LED display, a three-dimensional projection, an audio display, or a combination thereof. Furthermore, an RF sub-system/baseband processor 1410 may also be coupled to the processor 1402. The RF sub-system/baseband processor 1410 may include an antenna that is coupled to an RF receiver and to an RF transmitter (not shown). A communication port 1412, or more than one communication port 1412, may also be coupled to the processor 1402. The communication port 1412 may be adapted to be coupled to one or more peripheral devices 1414, such as a modem, a printer, a computer, a scanner, or a camera, or to a network, such as a local area network, remote area network, intranet, or the Internet, for example.

The processor 1402 may control the electronic system 1400 by implementing software programs stored in the memory 1416, 1418. The software programs may include an operating system, database software, drafting software, word processing software, media editing software, or media playing software, for example. The memory 1416, 1418 is operably coupled to the processor 1402 to store and facilitate execution of various programs. For example, the processor 1402 may be coupled to system memory 1418, which may include one or more of spin torque transfer magnetic random access memory (STT-MRAM), magnetic random access memory (MRAM), dynamic random access memory (DRAM) (e.g., synchronous DRAM (SDRAM) conforming with a double data rate (DDR) and/or graphics DDR (GDDR) standard (DDR4, DDR5, DDR6)), static random access memory (SRAM), racetrack memory, and other known memory types. The system memory 1416 may include volatile memory, non-volatile memory, or a combination thereof. The system memory 1416 is typically large so that it can store dynamically loaded applications and data. In some embodiments, the system memory 1416 may include one or more ball grid arrays (or other arrayed electrical interconnects) and associated signal configurations in accordance with this disclosure, such as the ball grid arrays and associated signal configurations described above.

The processor 1402 may also be coupled to non-volatile memory 1416, which is not to suggest that system memory 1418 is necessarily volatile. The non-volatile memory 1416 may include one or more of STT-MRAM, MRAM, read-only memory (ROM) such as an EPROM, resistive read-only memory (RROM), and flash memory to be used in conjunction with the system memory 1418. The size of the non-volatile memory 1416 is typically selected to be just large enough to store any necessary operating system, application programs, and fixed data. Additionally, the non-volatile memory 1416 may include a high-capacity memory such as disk drive memory, such as a hybrid-drive including resistive memory or other types of non-volatile solid-state memory, for example. In some embodiments, the non-volatile memory 1416 may include one or more ball grid arrays (or other arrayed electrical interconnects) and associated signal routing configurations in accordance with this disclosure, such as the ball grid arrays and associated signal routing configurations described above.

In some embodiments, the electronic system 1400 may include a graphics subsystem, such as a graphics card 1420, connected to the processor 1402. For example, each of the graphics card 1420 and the processor 1402 may be connected to, and supported on, a motherboard in their respective sockets (e.g., a peripheral component interconnect express (PCIe) socket for the graphics card 1420, a CPU socket for the processor 1402). The graphics card 1420 may include its own processing device, such as a graphics processing unit (GPU) or field-programmable gate array (FPGA) 1422. The GPU or FPGA 1422 may be configured to, and may be a dedicated device for, processing graphics-related tasks to accelerate the creation of images in a frame buffer intended for output to the display 1408. The graphics card 1420 may also include a memory bank, such as, for example, a graphics memory block 1424, which may include one or more high-speed memory devices connected to the GPU or FPGA 1422 and configured to store and facilitate acceleration of graphics-related data. More specifically, the graphics memory block 1424 may include one or more banks of devices configured as dynamic random access memory (DRAM) (e.g., synchronous DRAM (SDRAM) conforming with a double data rate (DDR) and/or graphics DDR (GDDR) standard (GDDR5, GDDR6, GDDR7)). In some embodiments, one or more of the graphics subsystem, graphics card 1420, GPU or FPGA 1422, and/or graphics memory block 1424 may include one or more substrates and associated engagement structures and supports in accordance with this disclosure.

In summary, a system in accordance with this disclosure, such as one configured as a server, may include, for example, a central processing unit (CPU) connected to at least one memory device. At least one memory device connected to the CPU may include a substrate supporting memory chips thereon. The substrate may include an edge connector at a longitudinal end of the substrate sized, shaped, and configured to provide external electrical connections for the memory devices. Hook-shaped engagement structures may be located proximate to, and laterally outward from and longitudinally trailing the edge connector, the engagement structures extending laterally beyond a lateral periphery of the substrate trailing the engagement structures, each engagement structure defining a recess. A carrier may include cutouts shaped, positioned, and configured to receive the hook-shaped engagement structures at least partially therein and posts located within the cutouts, the posts sized, positioned, and configured to be positioned in the recesses of the engagement structures to secure the end of the substrate to the carrier.

Memory devices in accordance with this disclosure may enable the adoption of relatively small form factors, such as for example a 1U memory module in the form of an SFF-TA-1006 card (i.e., printed circuit board carrying multiple memory devices such as non-volatile memory of a solid-state drive), may allow more efficient use of circuitry given the constraints for such form factors. Such memory devices may also be deployable in smaller spaces in greater quantities for use by certain computing systems, such as servers. Replacement of such carriers and memory device assemblies in the computing systems may also be facilitated. More specifically, disclosed are embodiments of engagement structures in the form of carriers and cooperatively configured memory cards that may allow the memory cards to be more easily secured to, and removed from, server or other computer system housings, which may facilitate easier plug-and-play deployment as well as easier removal and replacement.

Thus, it will be appreciated by those of ordinary skill in the art that embodiments of the disclosure provide both mechanical and electrical advantages in contrast to the state of the art. For example, the mutual cooperation of the carrier supports with the engagement structures and receipt of the substrate edges in the channels eliminates the need for fasteners near the interconnect end of the substrate while providing robust support for the substrate, and freeing additional substrate real estate and specifically lateral substrate width for conductive traces extending to pads of the edge connector. This arrangement further efficiently uses substrate placement area by eliminating the need for screw keep-outs. Further, embodiments of the carrier and memory devices according to the disclosure allow low power (e.g., 12 W or 16 W) memory devices to employ the same slots as a higher power (e.g., 15025 W) memory device. In one implementation, a carrier frame of 33.75 mm height, matches the height prescribed for higher-power SFF-TA-1006 specification boards with enclosures, and the end of the carrier frame provides the same features as those of the enclosures, allowing consistent application of a latch or cover to secure the assembly of carrier and memory device in a server chassis. In other words, carrier and memory device assemblies according to the disclosure may be implemented in a configuration to meet the form and fit requirements of the SFF-TA-1006 specification.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure.

What is claimed is:
1. An apparatus, comprising:
a substrate supporting at least one semiconductor device thereon, the substrate comprising:

an interface located proximate to an end of the substrate and sized, shaped, and configured to provide external electrical connection to the at least one semiconductor device; and engagement structures located proximate to, and laterally outward from, the interface, the engagement structures extending laterally beyond a longitudinal remainder of a lateral periphery of the substrate trailing the engagement structures, each engagement structure comprising a first depth at a first portion of the engagement structure and a second, smaller depth at a second, laterally inward portion of the engagement structure to define a recess therebetween; and a carrier comprising:

supports shaped, positioned, and configured to be positioned in the recesses of the engagement structures to secure the end of the substrate to the carrier; and a crossbar for positioning proximate to another opposite end of the substrate and sidewalls extending longitudinally from the crossbar for placement along the remainder of the lateral periphery of the substrate;

wherein the support comprise cutouts in the sidewalls, the cutouts positioned for alignment with the engagement structures of the substrate, and a post spanning each cutout, each post size, positioned, oriented, and configured to be received in a recess proximate to the second laterally inward portion of the each engagement structure to secure the end of the substrate to the carrier.

2. The apparatus of claim 1, wherein a line connecting a first point on the first portion located closest to the another, opposite end of the substrate to a second point on the second laterally inward portion located closest to the end of the substrate is oriented at an oblique angle when compared to a leading edge of the substrate at the end.

3. The apparatus of claim 1, wherein a maximum thickness of the substrate is 10 mm or less.

4. The apparatus of claim 1, wherein a power rating of the substrate is between 10 W and 14 W.

5. The apparatus of claim 1, further comprising holes extending through the crossbar, the holes sized and shaped to receive connectors through the holes to secure the carrier in place in a higher-level assembly.

6. The apparatus of claim 1, wherein a greatest width of the crossbar, as measured in a direction at least substantially perpendicular to major surfaces of the sidewalls, is equal to or less than 1U of a server rack.

7. The apparatus of claim 1, wherein the greatest width of the crossbar is equal to or less than 34 mm.

8. The apparatus of claim 1, further comprising holes extending through the substrate, the holes located proximate to the another, opposite end of the substrate.

9. The apparatus of claim 8, wherein the carrier comprises protrusions extending laterally inwardly from each sidewall toward each other sidewall, the protrusions comprising other holes extending through the protrusions, the other holes positioned to align with the holes in the substrate when the engagement structures are engaged with the supports.

10. The apparatus of claim 1, wherein the at least one semiconductor device comprises a first semiconductor device supported on a first major surface of the substrate and a second semiconductor device supported on a second major surface of the substrate, the first major surface located on a first side of the substrate, the second major surface located on a second, opposite side of the substrate.

11. The apparatus of claim 10, further comprising heat-management structures, each heat management structure located on a side of a respective one of the first semiconductor device or the second semiconductor device opposite the substrate.

12. The apparatus of claim 10, further comprising an overmold material covering at least the first semiconductor device and the second semiconductor device.

13. The apparatus of claim 12, wherein the overmold material covers a majority of each of the first major surface and the second major surface.

14. The apparatus of claim 1, wherein each sidewall of the carrier comprises longitudinally extending mutually parallel rails defining a channel therebetween aligned with the cutouts, lateral edges of the substrate being received in the channels and the posts received in recesses of the engagement structures.

15. A system, comprising:

a central processing unit connected to at least one memory device, the at least one memory device comprising a substrate supporting memory chips thereon, the substrate comprising:

an edge connector at a longitudinal end of the substrate sized, shaped, and configured to provide external electrical connections for the memory devices; and hook-shaped engagement structures located proximate to, and laterally outward from and longitudinally trailing the edge connector, the engagement structures extending laterally beyond a lateral periphery of the substrate trailing the engagement structures, each engagement structure defining a recess; and a carrier comprising:

a crossbar for positioning proximate to a second, opposite end of the substrate and sidewalls extending longitudinally from the crossbar for placement along the remainder of the lateral periphery of the substrate;

cutouts in the sidewalls, the cutouts shaped, positioned, and configured to receive the hook-shaped engagement structures at least partially therein; and posts located within the cutouts, the posts sized, positioned, and configured to be positioned in the recesses of the engagement structures to secure the end of the substrate to the carrier.

16. A method, comprising:

orienting a substrate comprising an interface located proximate to an end of the substrate such that another, opposite end of the substrate is proximate a crossbar of a carrier, the substrate supporting at least one semiconductor device thereon, the interface sized, shaped, and configured to provide external electrical connection to the at least one semiconductor device; and securing the end of the substrate to the carrier by engaging engagement structures located proximate to, and laterally outward from, the interface with supports of the carrier, the engagement structures extending laterally beyond a remainder of a lateral periphery of the substrate, each engagement structure comprising a first depth at a first portion of the engagement structure and a second, smaller depth at a second, laterally inward portion of the engagement structure, the supports being positioned laterally within the second portion of the engagement structures when the engagement structures are engaged with the supports;

wherein engaging the multiple engagement structure with the support comprising positioning a post of each support proximate to the multiple second laterally inward portions of the multiple engagement structures, each post spanning a cutout in a respective sidewall of the carrier extending from the crossbar along the remainder of the lateral periphery of the substrate.

17. The method of claim 16, wherein engaging the engagement structures with the support comprises orienting a line connecting a first portion located closest to another, opposite end of the substrate to a second point on the second laterally inward portion located closest to the end of the substrate to be at an oblique angle when compared to a leading edge of the substrate at the end.

18. The method of claim 16, further comprising inserting the substrate longitudinally into the carrier between the sidewalls, surfaces defining the cutouts located proximate to ends of the posts and aligned with channels between longitudinally extending, laterally inwardly protruding rails of the sidewalls, the channels each receiving a lateral edge of the substrate.

19. The method of claim 16, further comprising aligning holes extending through the substrate with other holes extending through protrusions of the carrier, the holes of the substrate located proximate to another, opposite end of the substrate, each protrusion extending from a respective sidewall of the carrier toward another respective sidewall, each protrusion comprising one of the other holes extending through the protrusion, each respective sidewall extending from the crossbar along the remainder of the lateral periphery of the substrate.

20. The method of claim 19, further comprising securing the other end of the substrate to the carrier by inserting an attachment member through each set of a hole of the substrate and another hole of a respective protrusion of the carrier.

21. The method of claim 16, further comprising securing the carrier within an equipment rack of a server.

22. A carrier for a memory module, comprising:
a crossbar extending laterally between mutually parallel sidewalls at one end of the carrier;
mutually parallel rails defining channels extending longitudinally from proximate the crossbar to proximate an opposing end of the carrier;
a support structure comprising a post extending vertically between the rails of each sidewall in a channel, the support structure further comprising a cutout in an adjacent sidewall laterally outwardly of the post; and
protrusions proximate the crossbar and extending laterally inwardly from each sidewall, the protrusions extending inwardly of a channel of the respective sidewall of the protrusion, each protrusion having a vertical aperture therethrough positioned for alignment with an aperture of a memory module having lateral edges received within the channel and recesses of laterally outwardly protruding engagement structures of a substrate receiving the posts therein.

23. A memory module, comprising:
a substrate bearing multiple memory chips on at least one side thereof;
the substrate having an interconnect in the form of an edge connector at one end thereof in communication with the multiple memory chips utilizing the substrate;
engagement structures on opposing edges of the substrate longitudinally trailing the interconnect and extending laterally outwardly therefrom, the engagement structures comprising hooks defining recesses opening to the rear of the engagement structures;
a portion of the substrate trailing the engagement structures of a lesser width than a width of the substrate at the engagement structures; and
apertures proximate an end of the substrate opposite the interconnect adjacent opposing edges of the substrate;
wherein a line connecting a first point on a first portion of the engagement structure located closest to another, opposite end of the substrate to a second point on a second portion of the engagement structure located closest to the one end of the substrate os oriented at an oblique angle when compared to a leading edge of the substrate at the end of the substrate.

* * * * *

UNITED STATES PATENT AND TRADEMARK OFFICE
CERTIFICATE OF CORRECTION

PATENT NO. : 11,968,797 B2
APPLICATION NO. : 17/393572
DATED : April 23, 2024
INVENTOR(S) : Michael G. Placke It is certified that error appears in the above-identified patent and that said Letters Patent is hereby corrected as shown below:

In the Claims

| | | | |
|---|---|---|---|
| Claim 1, | Column 13, | Lines 19-20, | change "proximate to another opposite end" to --proximate to another, opposite end-- |
| Claim 1, | Column 13, | Line 24, | change "wherein the support comprise cutouts" to --wherein the supports comprise cutouts-- |
| Claim 1, | Column 13, | Line 27, | change "post size, positioned," to --each post sized, positioned,-- |
| Claim 16, | Column 14, | Line 65, | change "engagement structure with" to --engagement structures with-- |
| Claim 16, | Column 14, | Line 66, | change "support comprising positioning" to --support comprises positioning-- |
| Claim 17, | Column 15, | Line 7, | change "connecting a first portion located" to --connecting a first point on the first portion located-- |
| Claim 23, | Column 16, | Line 33, | change "engagement structure located" to --engagement structures located-- |
| Claim 23, | Column 16, | Line 35, | change "engagement structure located" to --engagement structures located-- |
| Claim 23, | Column 16, | Line 36, | change "substrate os oriented" to --substrate is oriented-- |

Signed and Sealed this
Third Day of September, 2024

*Katherine Kelly Vidal*

Katherine Kelly Vidal
*Director of the United States Patent and Trademark Office*